(12) United States Patent
Inoue

(10) Patent No.: US 8,410,558 B2
(45) Date of Patent: Apr. 2, 2013

(54) SEMICONDUCTOR DEVICE WITH FIELD PLATES

(75) Inventor: Kazutaka Inoue, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 35 days.

(21) Appl. No.: 13/182,933

(22) Filed: Jul. 14, 2011

(65) Prior Publication Data

US 2012/0012858 A1     Jan. 19, 2012

(30) Foreign Application Priority Data

Jul. 14, 2010    (JP) .................................. 2010-160111

(51) Int. Cl.
*H01L 29/66*     (2006.01)
(52) U.S. Cl. ................................ 257/409; 257/E29.136
(58) Field of Classification Search .................. 257/170, 257/171, 409, E29.136
See application file for complete search history.

(56) References Cited

U.S. PATENT DOCUMENTS

| | | | |
|---|---|---|---|
| 7,521,768 B2 * | 4/2009 | Theeuwen et al. ............ | 257/408 |
| 7,763,910 B2 * | 7/2010 | Marui et al. ................... | 257/192 |
| 2006/0175670 A1 * | 8/2006 | Tsubaki ........................ | 257/409 |
| 2006/0220154 A1 * | 10/2006 | Gajadharsing et al. ....... | 257/409 |
| 2007/0228497 A1 | 10/2007 | Shimizu | |
| 2008/0272443 A1 * | 11/2008 | Hoshi et al. .................... | 257/409 |

FOREIGN PATENT DOCUMENTS

JP     2007-273920 A     10/2007

* cited by examiner

*Primary Examiner* — William D Coleman
(74) *Attorney, Agent, or Firm* — Westerman, Hattori, Daniels & Adrian, LLP

(57) ABSTRACT

A semiconductor device includes source fingers and drain fingers provided on an active region of a nitride semiconductor layer alternately, gate fingers having a side edge and a distal edge, a first insulation film provided on the nitride semiconductor layer and covers a top face, the side and distal edges of the gate fingers, field plates provided on the first insulation film between the gate fingers and the drain fingers, a minimum distance between the side face of the first insulation film located on the side edge of the gate fingers and the field plate being at least 100 nm, and field plate interconnections provided on the first insulation film and located outside of the active region and electrically connected with the source fingers and the field plates, a minimum distance between the side face of the first insulation film located on the distal edge of the gate fingers and the field plate interconnections being at least 100 nm.

14 Claims, 5 Drawing Sheets

SEMICONDUCTOR DEVICE WITH FIELD PLATES

CROSS-REFERENCE TO RELATED APPLICATION

This application is based upon and claims the benefit of priority of the prior Japanese Patent Application No. 2010-160111, filed on Jul. 14, 2010, the entire contents of which are incorporated herein by reference.

BACKGROUND (i) Technical Field

A certain aspect of the embodiments discussed herein is related to a semiconductor device. Another aspect o the embodiments is related to a semiconductor device configured to have a field plate formed on an insulation film between a gate finger and a drain finger.

(ii) Related Art

Semiconductor devices using a nitride semiconductor are used as power devices that operate at high frequencies and output high power. FETs (Field Effect Transistors) such as a HEMT (High Electron Mobility Transistor) are known as transistors suitable for amplification in a high-frequency or RF (Radio Frequency) band, which may include microwaves, quasi-millimeter waves or millimeter waves.

In the power FET, it is known to use a field plate on an insulation film between a gate finger and a drain finger (see Japanese Patent Application Publication No. 2007-273920, for example). The field plate that is kept at a predetermined potential (for example, ground potential) functions to relax the electric field intensity under the field plate between the gate finger and the drain finger. The field plate provided above an area having a strong electric field intensity equalizes the electric field intensity between the gate finger and the drain finger, and improves the source-drain breakdown voltage or the gate-drain breakdown voltage. This enables high power amplification. The equalization of the electric field intensity suppresses the current collapse.

As illustrated in FIG. 2(a) of the above application publication, the insulation later provided so as to cover the gate electrode has a step resulting from the shape of the gate electrode, and the field plate is formed along the step of the insulation layer. The semiconductor device having this structure has a possibility of failure when it is operated with a high voltage at high temperature.

SUMMARY

According to an aspect of the present invention, there is provided a semiconductor device including: source fingers and drain fingers provided on an active region of a nitride semiconductor layer alternately; gate fingers provided between the source fingers and the drain fingers and having a side edge and a distal edge; a first insulation film provided on the nitride semiconductor layer and covers a top face, the side edge and the distal edge of the gate fingers; field plates provided on the first insulation film between the gate fingers and the drain fingers, a minimum distance between the side face of the first insulation film located on the side edge of the gate fingers and the field plate being at least 100 nm; field plate interconnections provided on the first insulation film and located outside of the active region and electrically connected with the source fingers and the field plates, a minimum distance between the side face of the first insulation film located on the distal edge of the gate fingers and the field plate interconnections being at least 100 nm.

DETAILED DESCRIPTION

Figure 1:
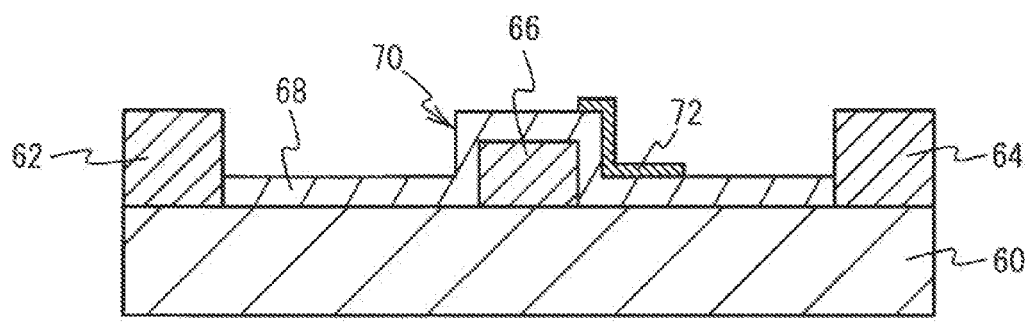
FIG. 1 is a schematic cross-sectional view of a semiconductor device in accordance with a comparative example.

First, a semiconductor device in accordance with a comparative example is described. FIG. 1 is a cross-sectional view of a semiconductor device of a comparative example. Referring to FIG. 1, a source finger 62, a drain finger 64, and a gate finger 66 are formed on a semiconductor layer 60 composed of a seed layer, a GaN channel layer, an AlGaN electron supply layer and a GaN cap layer, which layers are sequentially stacked on, for example, a SiC substrate. The gate finger 66 is provided between the source finger 62 and the drain finger 64. An insulation film 68 is provided on the semiconductor layer 60 so as to cover the gate finger 66. A step portion 70 is formed on the insulation film 68 so as to reflect the shape of the gate finger 66. A field plate 72 is formed on the insulation film 68 between the gate finger 66 and the drain finger 64 along the step portion 70. The field plate 72 is electrically connected to the source finger 62.

A defective semiconductor device of the comparative example in which a failure occurs is now analyzed. It is seen from the analysis that a break occurs between the gate finger 66 and the field plate 72, particularly, in the insulation film 68 in the step portion 70. It may be considered that the gate finger 66 and the field plate 72 form a capacitor in which the insulation film 68 interposed between them serves as a dielectric. The insulation film 68 has a small thickness and a poor film quality in the step portion 70. Thus, a sufficient life may not be established between the gate finger 66 and the field plate 72 with respect to the temperature and voltage in real operation. Particularly, a high voltage of, for example, 50 V may be applied to the drain finger 64 because the semiconductor device using a nitride semiconductor is used as a power device capable of operating at high frequencies and outputting high power. The voltage applied to the gate finger 66 is also high. Thus, the potential difference between the field plate 72 electrically connected to the source finger 62 and the gate finger 62 may break a poor quality portion of the insulation film 68 in the step portion 70 between the field plate 72 and the gate finger 66.

Taking the above into consideration, a capacitor is configured to have a structure in which the insulation film is formed so as to cover a lower electrode (which corresponds to the above-described gate electrode) and an upper electrode (which corresponds to the above-described field plate), and a TDDB (Time Dependent Dielectric Breakdown) test is performed. The results of the test show that an initial failure that is farther from a capacitor having a flat structure occurs. For example, the 0.1% failure life, which is an index of the reliability requirement, is estimated as 0.8 year at an operating temperature of 200° C. with a voltage of 20 V and is estimated as 5 years with a voltage of 10 V. This is a problem to be solved to realize higher-temperature, higher-voltage operation of the semiconductor device configured as illustrated in FIG. 1. According to a certain aspect of embodiments described below, the occurrence of failures may be suppressed even when the semiconductor device is operated with a high voltage at high temperature.

First Embodiment

Figure 2:
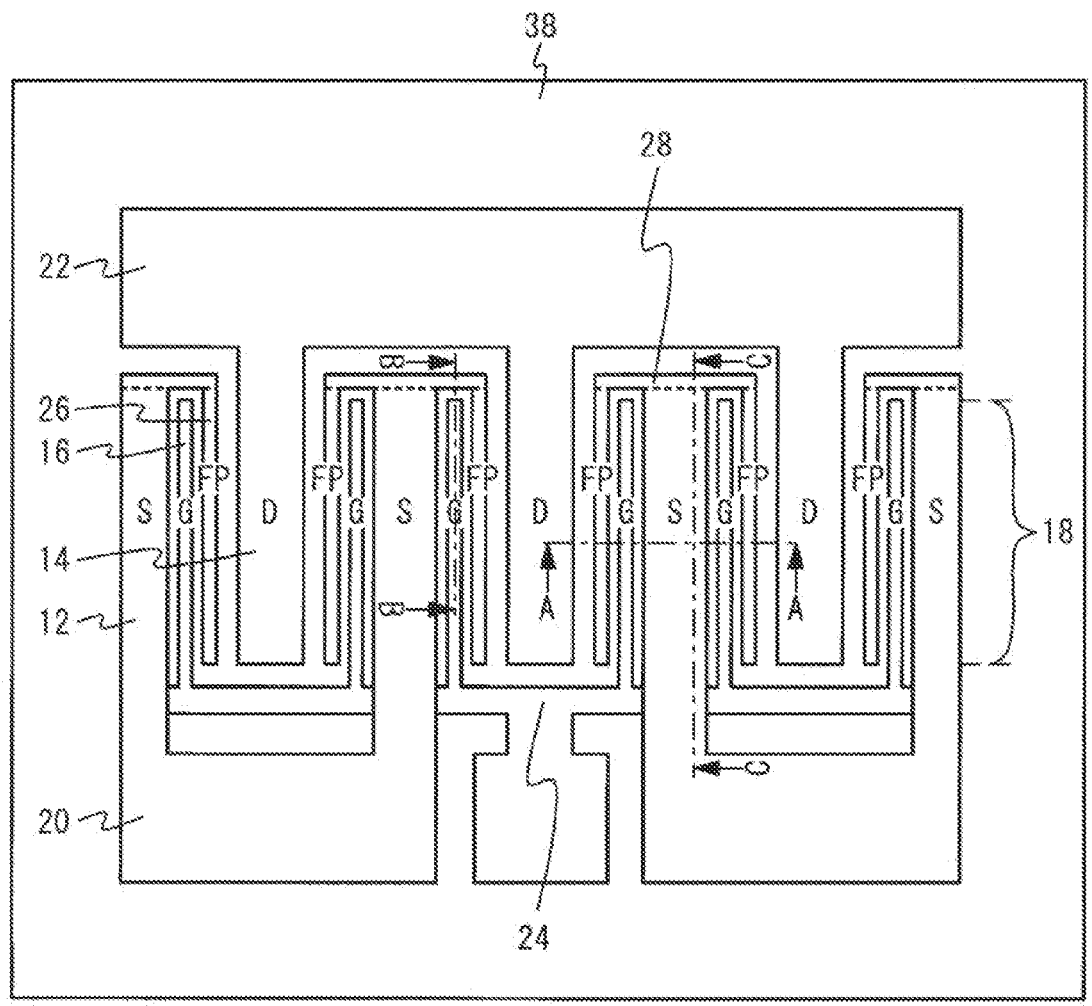
FIG. 2 is a schematic plan view of a semiconductor device in accordance with a first embodiment.

FIG. 2 is a schematic plan view of a semiconductor device in accordance with a first embodiment. Referring to FIG. 2, on a GaN cap layer 38, there are provided a plurality of source fingers 12, a plurality of drain fingers 14 and a plurality of gate fingers 16. The source fingers 12 are arranged in parallel with each other in an active region 18. The drain fingers 14 are arranged in parallel with each other so that the drain fingers 14 and the source fingers 12 are alternately arranged. Each of the gate fingers 16 is provided between the adjacent source finger 12 and the drain finger 14. The source fingers 12, the drain fingers 14 and the gate fingers 16 extend in the same direction. The direction in which the source fingers 12 extend is defined as a finger direction. In the active region 18, the source fingers 12, the drain fingers 14 and the gate fingers 16 are interleaved.

The source fingers 12 are connected together by a source bus line 20 outside of the active region 18. Similarly, the drain fingers 14 are connected together by a drain bus line 22 outside of the active region 18. The gate fingers 16 are connected together by a gate bus line 24 outside of the active region 18. The source bus line 20 and the drain bus line 22 are opposite to each other across the active region 18. A gate bus line 24 is provided at the same side of the active region 18 as the source bus line 20. Thus, the gate bus line 24 and the source fingers 12 cross each other so that a first insulation film 44 is interposed therebetween.

A plurality of field plates 26 are provided on the first insulation film 44 between the gate fingers 16 and the drain fingers 14. The field plates 26 located at both sides of each of the source fingers 12 are connected to the corresponding source finger 12 by a field plate interconnection 28, which is located outside of the active region 18 and is provided on the first insulation layer 44. That is, the field plate interconnections 28 are provided in a direction that crosses the finger direction. Thus, the source fingers 12 and the field plates 26 are electrically connected by the field plate interconnections 28.

Figure 3A:
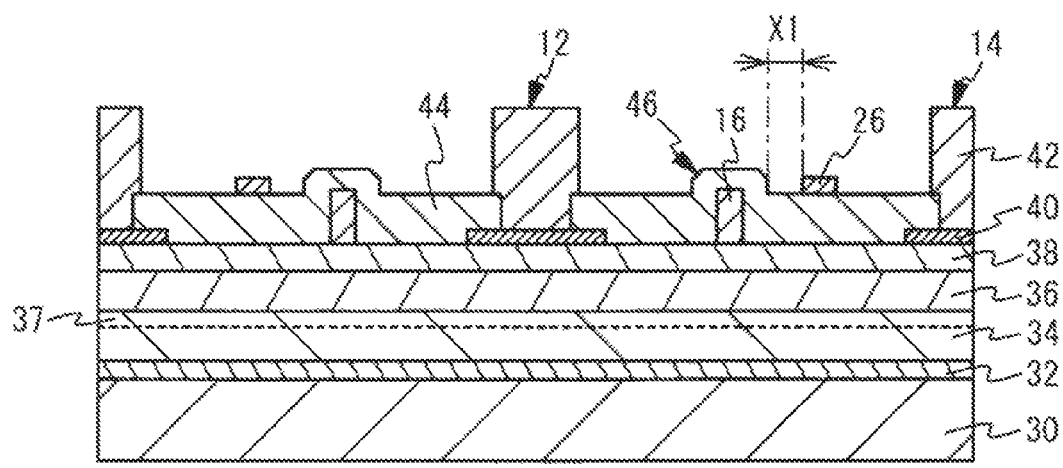
FIG. 3A is a schematic cross-sectional view taken along a line A-A in FIG. 2.
Figure 3B:
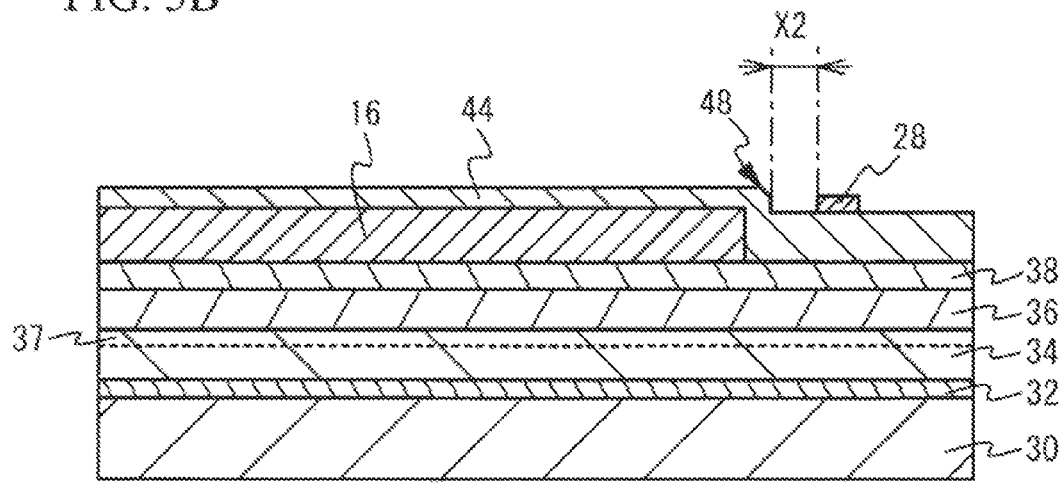
FIG. 3B is a schematic cross-sectional view taken along a line B-B in FIG. 2.

FIG. 3A is a schematic cross-sectional view taken along a line A-A illustrated in FIG. 2, and FIG. 3B is a schematic cross-sectional view taken along a line B-B in FIG. 2. As illustrated in FIG. 3A, on a SiC substrate 30, there are sequentially stacked a seed layer 32 made of AlN (aluminum nitride), a GaN channel layer 34, an n-type AlGaN electron supply layer 36 and an n-type GaN cap layer 38. The seed layer 32 may be 300 nm thick, for example. The GaN channel layer 34 may be 1000 nm thick, for example. The AlGaN electron supply layer 36 may be 20 nm thick, for example. The GaN cap layer 38 may be 5 nm thick, for example. A channel 37 is formed by 2DEG (two dimensional gas) at an interface between the GaN channel layer 34 and the AlGaN electron supply layer 36. The SiC substrate 30 may be replaced by a sapphire substrate or Si (silicon) substrate.

The gate fingers 16 are provided in contact with the upper surface of the GaN cap layer 38. The source finger 12 and the drain finger 14 are provided at both sides of each of the gate fingers 16 so as to contact the upper surface of the GaN cap layer 38. Each of the source fingers 12 and the drain fingers 14 is composed of an ohmic electrode 40 and an interconnection layer 42. The first insulation film 44 is provided on the upper surface of the GaN cap layer 38 so as to cover the top and side surfaces of the gate fingers 16. The first insulation film may be 300 nm thick, for example. The source fingers 12 and the drain fingers 14 protrude from the first insulation film 44. The first insulation film 44 has first step portions 46 resulting from the shapes of the gate fingers 16.

The field plates 26 are provided on the first insulation film 44 and are located between the gate fingers 16 and the drain fingers 14. The field plates 26 are away from the first step portions 46 and are provided on a flat surface portion of the first insulation film 44. A distance X1 between the field plates 26 and the first step portions 46 on the first insulation film 44 may be 300 nm, for example.

As illustrated in FIG. 3B, a second step portion 48 resulting from the shape of the gate finger 16 is formed in the first insulting film 44 at the end of the gate finger 16, more specifically, a distal edge of the gate finger 16. The field plate interconnection 28 is provided in front of the distal edge of the gate finger 16 and is located outside of the active region 18. The field plate interconnection 28 is away from the second step portion 48 and is provided on the flat surface of the first insulation film 44. A distance X2 between the field plate interconnection 28 and the second step portion 48 formed on the first insulation film 44 may be 1 μm, for example.

Figure 4A:
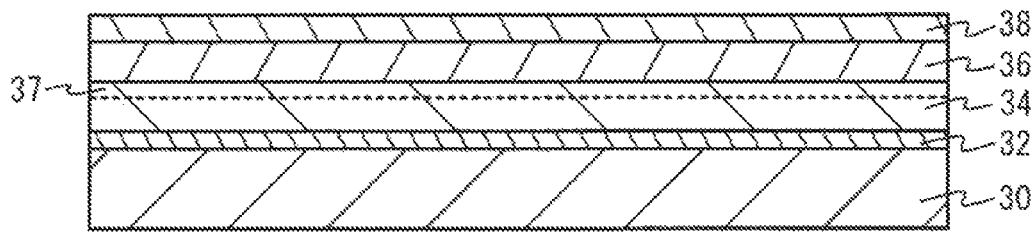
FIGS. 4A through 4D are schematic cross-sectional views that illustrate a method for fabricating the semiconductor device in accordance with the first embodiment.

A description is now given, with reference to FIGS. 4A through 5D, of a method for fabricating the semiconductor device of the first embodiment. FIGS. 4A through 4D are schematic cross-sectional views corresponding to the line A-A in FIG. 2. FIGS. 5A through 5D are schematic cross-sectional views corresponding to the line B-B in FIG. 1. As illustrated in FIGS. 4A and 5A, on the SiC substrate 30, there are epitaxially grown the seed layer 32, the GaN channel layer 34, the AlGaN electron supply layer 36 and the GaN cap layer 38 by a MOCVD (Metal Organic Chemical Vapor Deposition) method.

Figure 4B:
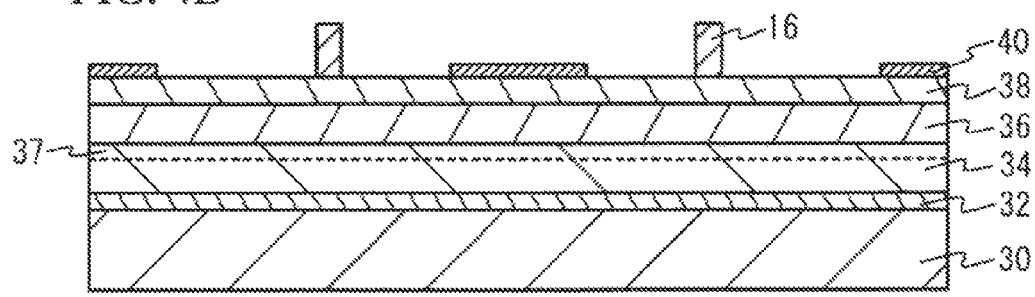
Figure 5A:
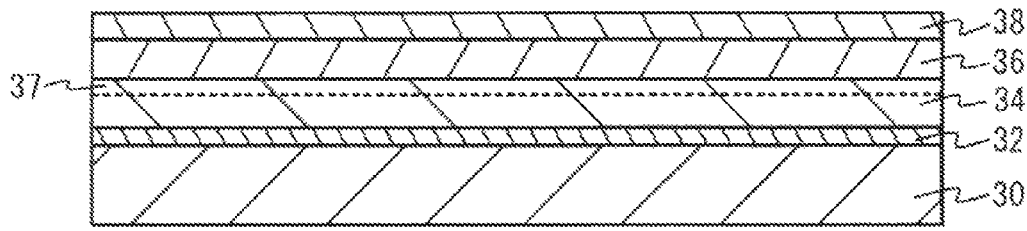
FIGS. 5A through 5D are other schematic cross-sectional views that illustrate the method for fabricating the semiconductor device in accordance with the first embodiment.
Figure 5B:
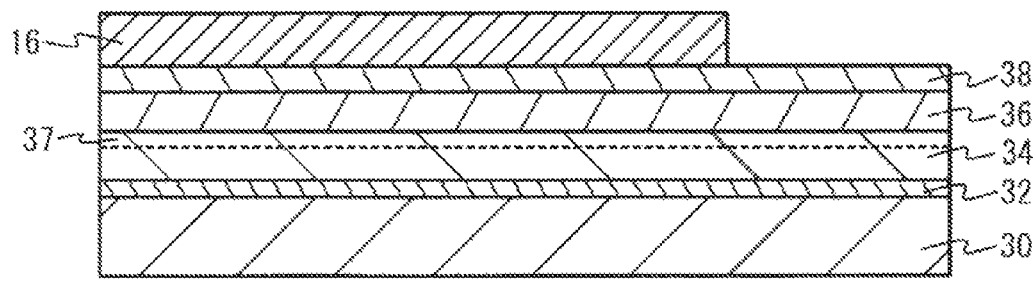

As illustrated in FIGS. 4B and 5B, Ti (titanium) and Al (aluminum) are serially stacked on the GaN cap layer 38 in that order by, for example, a vapor deposition method and a liftoff method, and are annealed at a temperature of 500° C. to 600° C. This process results in the ohmic electrodes 40 that are in ohmic contact with the AlGaN electron supply layer 36. Then, Ni (nickel) and Au (gold) are serially stacked on the GaN cap layer 38 in that order between the source fingers 12 and the drain fingers 14 by, for example, the vapor deposition method and the liftoff method. This process results in the gate fingers 16. At the same time as the gate fingers 16 are formed, the gate bus line 24 is formed outside of the active region 18.

Figure 4C:
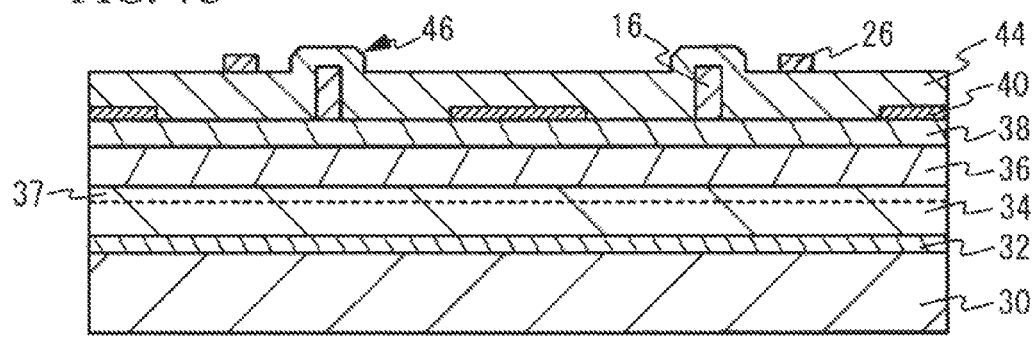
Figure 5C:
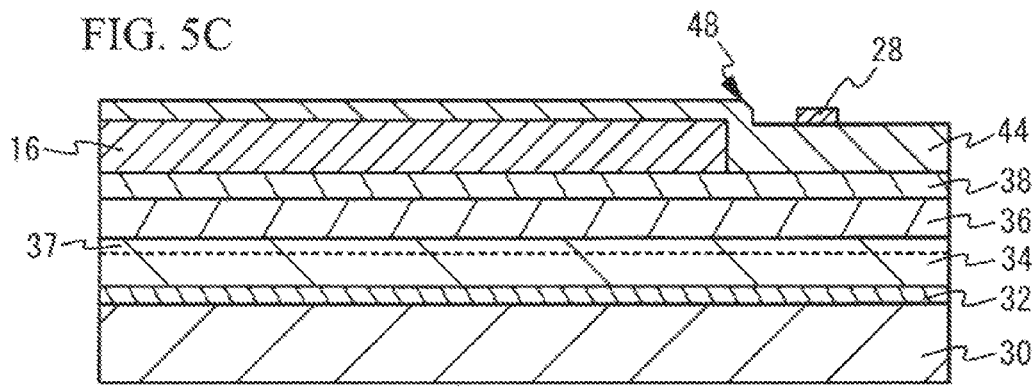

As illustrated in FIGS. 4C and 5C, the first insulation film 44 made of SiN (silicon nitride) is formed on the GaN cap layer 38 so as to cover the top and side surfaces of the gate fingers 16 by, for example, a plasma-assisted CVD method. Then, Ti and Au are serially stacked on the first insulation film 44 in that order by, for example, the vapor deposition method and the liftoff method. This process concurrently form the field plates 26 and the field plate interconnections 28.

Figure 4D:
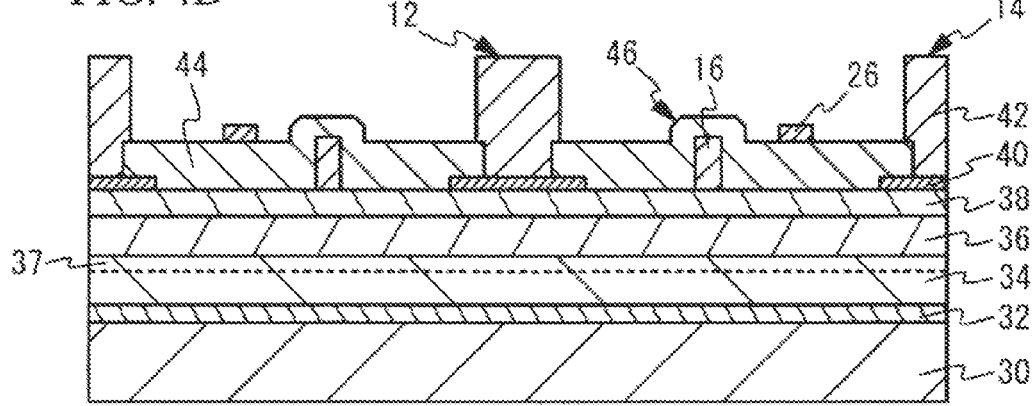
Figure 5D:
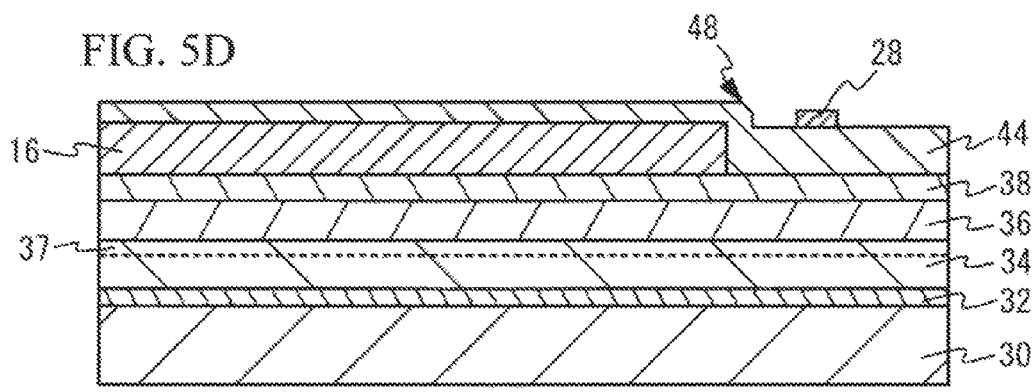

As illustrated in FIGS. 4D and 5D, openings are formed in the first insulation film 44 above the ohmic electrodes 40, and the interconnection layers 42 made of Au, for example, are formed so as to be buried in the openings and be in contact with the ohmic electrodes 40. Thus, the source fingers 12 and the drain fingers 14 formed by the ohmic electrodes 40 and the interconnection layers 42 are formed. The semiconductor device of the first embodiment is fabricated as described above.

The first embodiment has a multi-finger structure in which the source fingers 12, the drain fingers 14 and the gate fingers 16 are formed on the upper surface of the GaN cap layer 38. The field plates 26 formed on the first insulation film 44 between the gate fingers 16 and the drain fingers 14 are 300 nm away from the first step portions 46 of the first insulation film 44 resulting from the side walls of the gate fingers 16 in the gate finger extending direction. Each of the field plate interconnections 28, which connects the field plates 26 located at both sides of the corresponding source finger 12, is arranged outside of the active region 18, and is 1 μm away from the second step portion 48 of the first insulation film 44 resulting from the distal edge of the gate finger 16. The field plates 26 and the field plate interconnections 28 are provided away from the poor film quality portions of the first insulation film 44, that is, the first step portions 46 and the second step portions 48. It is thus possible to restrict the first insulation film from being broken and suppress the occurrence of failures even when the semiconductor device is operated with a high voltage at high temperature.

The above-described first embodiment has a distance X1 of 300 nm between the field plates 26 and the first step portions 46 of the first insulation film 44. It is noted that the above value of the distance X1 is selected in such a manner that a proper margin is added to the relative precision of aligning the field plates 26 with the gate fingers 16 in order to prevent the field plates 26 from overlaying the first step portions 46, and is preferably as small as possible in terms of the characteristics. In a lithography capable of ensuring a highly precise alignment such as the electron beam exposure technique, it is mostly desired to define the distance X1 with an alignment margin of 100 nm throughout the process. Even in an optical exposure technique having a less alignment precision due to practical restrictions such an i-ray exposure technique, the structure of the first embodiment may be realized by defining the distance X1 with an alignment margin of 300 nm, which is selected taking into consideration an alignment error of ±200 nm and a margin 100 nm resulting from another factor. From the above consideration, it is preferable that the distance X1 between the field plates 26 and the first step portions 46 of the first insulation film 44 is equal to or longer than 100 nm. The distance X1 may be 300 nm or longer. The distance X2 between the field plate interconnections 28 and the second step portions 48 of the first insulation film 44 is not limited to 1 μm but may be an arbitrary distance equal to or longer than 100 nm. For example, the distance X2 may be equal to or longer than 1 μm. The increased distances X1 and X2 may not cause any serious characteristic degradation but may be selected taking into consideration the alignment margin to be secured, the chip size and the production cost.

The multi-finger structure employed in the first embodiment is suitable for realizing the high-frequency, high-output characteristics. The structure in which the nitride semiconductor layers are used as the operating layers results in a high power per unit length of the gate fingers 16. However, there is a limit on narrowing the intervals between the adjacent gate fingers 16 in terms of the power density. That is, the FET (for example, HEMT) of the multi-finger type in which the nitride semiconductor layers are used as the operating layers, it is very difficult to reduce the pattern in the direction crossing the finger direction. In order to increase the chip yield, a reduction in the finger direction may be attempted. However, when attention is paid to the poor film quality in the first step portions 46 and the second step portions 48 of the first insulation film 44, it is effective to suppress the occurrence of failures by arranging the field plate interconnections 28 in the direction crossing the direction in which the source fingers 12 extend outside of the active region 18 and keeping the second step portions 48 of the first insulation film 44 resulting from the distal edges of the gate fingers 16 away from the field plate interconnections 28 by the distance X2 set equal to at least 100 nm.

The thickness of the first insulation film 44 of the first embodiment is not limited to 300 nm but may be selected appropriately. However, when the first insulation film 44 is too thick, the field plates 26 may not relax the electric field effectively. When the first insulation film 44 is thicker than 600 nm, the field plates 26 may not reduce the field back capacitance greatly and may affect the RF characteristics and the collapse suppression effect considerably. Thus, the first insulation film 44 is preferably 600 nm thick or less. When the first insulation film 44 is too thin, a break may occur in not only the first step portions 46 and the second step portions 48 but also the flat portions. Thus, the first insulation film 44 is preferably 200 nm thick or more. Thus, the thickness of the first insulation film 44 is preferably between 200 nm and 600 nm, more preferably between 300 nm and 500 nm, and much more preferably between 300 nm and 400 nm.

The first embodiment is not limited to HEMT, but may be semiconductor devices using a nitride semiconductor other than HEMT. The nitride semiconductor may be GaN, InN, AlN, AlGaN, InGaN, AlInGaN, for example.

Second Embodiment

Figure 6A:
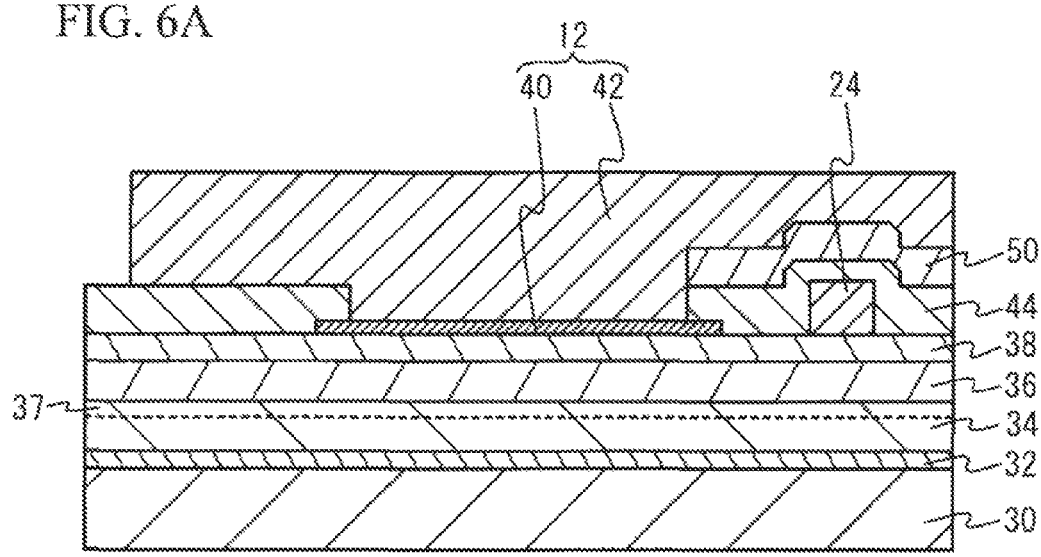
FIG. 6A is a schematic cross-sectional view of a semiconductor device in accordance with a second embodiment taken along a line corresponding to a line C-C in FIG. 2.
Figure 6B:
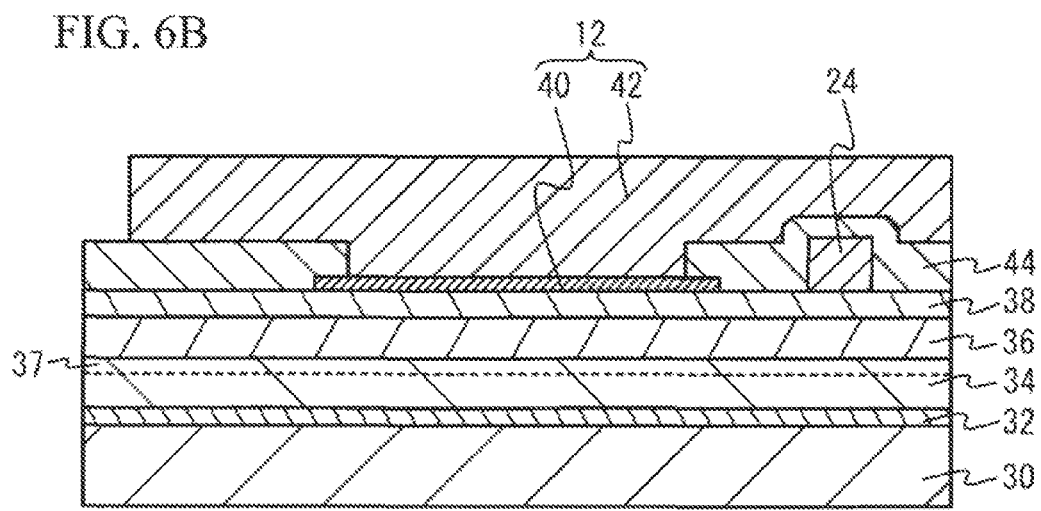
FIG. 6B is a schematic cross-sectional view of the semiconductor device of the first embodiment taken along the line C-C in FIG. 2.

FIG. 6A is a schematic cross-sectional view of a semiconductor device in accordance with a second embodiment, which view corresponds to the line C-C in FIG. 2. For comparison with FIG. 6A, FIG. 6B is a schematic cross-sectional view of the semiconductor device of the first embodiment, which view corresponds to the line C-C in FIG. 2. As illustrated in FIG. 6B, the semiconductor device of the first embodiment is configured so that the gate bus line 24 and the source finger 12 cross each other so that the first insulation film 44 is interposed therebetween.

As described above, the semiconductor device of the multi-finger structure has an area in which the gate bus line 24 and the source finger 12 cross each other so that the first insulation film 44 is interposed therebetween. The area is located outside of the active region 18. Thus, the electric field intensity applied to the first insulation film 44 is weak, and is hardly broken.

The semiconductor device of the second embodiment illustrated in FIG. 6A is configured interpose a second insulation film 50 as well as the first insulation film 44 between the gate bus line 24 and the source finger 12. It is thus possible to improve the breakdown voltage between the gate bus line 24 and the source finger 12. The first insulation film 44 tends to be made thin in order to relax the electric field of the field plate 26 formed on the upper surface of the first insulation film 44. Thus, in order to secure the breakdown voltage between the gate bus line 24 and the source finger 12, it is preferable to interpose the first insulation film 44 and the second insulation film 50 therebetween.

The present invention is not limited to the specifically described embodiments, but may include other embodiments and variations without departing from the scope of the present invention.

What is claimed is:

1. A semiconductor device comprising:
source fingers and drain fingers provided on an active region of a nitride semiconductor layer alternately;
gate fingers provided between the source fingers and the drain fingers and having a side edge and a distal edge;
a first insulation film provided on the nitride semiconductor layer and covers a top face, the side edge and the distal edge of the gate fingers;
field plates provided on the first insulation film between the gate fingers and the drain fingers, a minimum distance between the side face of the first insulation film located on the side edge of the gate fingers and the field plate being at least 100 nm; and
field plate interconnections provided on the first insulation film and located outside of the active region and electrically connected with the source fingers and the field plates, a minimum distance between the side face of the first insulation film located on the distal edge of the gate fingers and the field plate interconnections being at least 100 nm.

2. The semiconductor device according to claim 1, wherein the first insulation film is a silicon nitride film.

3. The semiconductor device according to claim 1, wherein the first insulation film has a thickness of 200 nm to 600 nm.

4. The semiconductor device according to claim 1, wherein the field plates are at least 300 nm away from the side face of the first insulation film located on the side edge of the gate fingers, and the field plate interconnections are at least 1 µm away from the side face of the first insulation film located on the distal edge of the gate finger.

5. The semiconductor device according to claim 1, further comprising:
a gate bus line that is provided on the nitride semiconductor layer in a direction crossing a direction in which the gate fingers extend and has top and side surfaces covered with the first insulation film, the gate bus line electrically connecting the gate fingers; and
a second insulation film located above the gate bus line and the first insulation film,
the source fingers located above the gate bus line, the first insulation film and the second insulation film.

6. The semiconductor device according to claim 1, wherein the first insulation film has a thickness of 300 nm to 500 nm.

7. The semiconductor device according to claim 1, wherein the first insulation film has a thickness of 300 nm to 400 nm.

8. The semiconductor device according to claim 1, wherein the nitride semiconductor layer comprised by GaN, InN, AlN, AlGaN, InGaN or AlInGaN.

9. The semiconductor device according to claim 1, further comprising:
a source bus line that is provided on the nitride semiconductor layer in a direction crossing a direction in which the source fingers extend, the source bus line electrically connecting the source fingers.

10. The semiconductor device according to claim 1, further comprising:
a drain bus line that is provided on the nitride semiconductor layer in a direction crossing a direction in which the drain fingers extend, the drain bus line electrically connecting the drain fingers.

11. The semiconductor device according to claim 2, wherein the silicon nitride film is formed by a plasma-assisted CVD.

12. The semiconductor device according to claim 5, wherein the gate bus line is formed outside of the active region of the nitride semiconductor layer.

13. The semiconductor device according to claim 9, wherein the source bus line is formed outside of the active region of the nitride semiconductor layer.

14. The semiconductor device according to claim 10, wherein the drain bus line is formed outside of the active region of the nitride semiconductor layer.

* * * * *